United States Patent [19]

Beunders

[11] 4,201,944
[45] May 6, 1980

[54] RECEIVER HAVING A MEASUREMENT INSTRUMENT WHICH IS USED AS A TUNING SCALE

[75] Inventor: Johan W. Beunders, Eindhoven, Netherlands

[73] Assignee: U.S. Philips Corporation, New York, N.Y.

[21] Appl. No.: 958,319

[22] Filed: Nov. 6, 1978

Related U.S. Application Data

[63] Continuation of Ser. No. 790,297, Apr. 25, 1977, abandoned.

[30] Foreign Application Priority Data

Apr. 27, 1976 [NL] Netherlands .......................... 7604444

[51] Int. Cl.² .............................................. H04B 1/06
[52] U.S. Cl. ...................................... 455/155; 455/195
[58] Field of Search .............. 325/455, 452, 464, 468, 325/363, 364, 67, 457, 465; 334/18, 29, 48, 86; 358/191, 192, 193

[56] References Cited

U.S. PATENT DOCUMENTS

| | | | |
|---|---|---|---|
| 3,573,734 | 4/1969 | Williams et al. | 325/455 |
| 3,667,052 | 5/1972 | Effenberger | 325/455 |
| 3,767,112 | 10/1973 | Tonari | 325/455 |
| 4,156,198 | 5/1979 | Heuer | 325/455 |

Primary Examiner—John C. Martin
Assistant Examiner—Tommy P. Chin
Attorney, Agent, or Firm—Thomas A. Briody; William J. Streeter; Edward W. Goodman

[57] ABSTRACT

With a receiver, tunable by means of a tuning voltage, which receiver is provided with a measuring instrument as a tuning scale, a convenient adjustment of presetting potentiometers to transmitters found by means of a main tuning device is enabled by a periodically switching of the measuring instrument between the relevant presetting potentiometer and the main tuning device.

4 Claims, 1 Drawing Figure

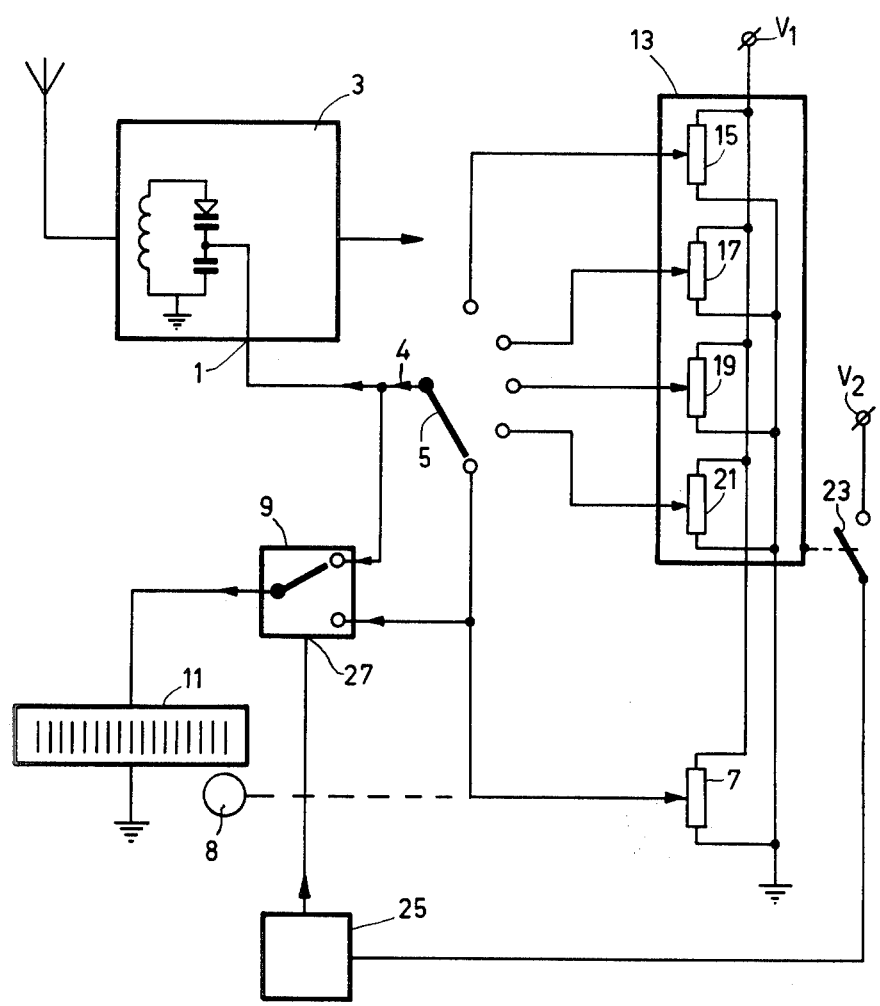

RECEIVER HAVING A MEASUREMENT INSTRUMENT WHICH IS USED AS A TUNING SCALE

This is a continuation of application Ser. No. 790,297, filed 4/25/77, now abandoned.

The invention relates to a receiver having a measuring instrument which is used as a tuning scale for measuring a tuning signal value which ensures a tuning of the receiver, comprising a presetting device for obtaining a tuning signal value which is used for a tuning to a given frequency.

Radio Mentor Electronic 1975, vol. 41, No. 5, page 196 discloses a receiver of the above-mentioned type. An important advantage of the use of a measuring instrument as a tuning scale is that a tuning to preset transmitters is indicated by the same scale as a tuning obtained by means of a possible manual setting so that it is easy to perform a setting of the presetting device.

It is an object of the invention to facilitate the setting of the presetting device to a desired transmitter still further.

A receiver of the type mentioned in the preamble according to the invention is therefore characterized in that the receiver comprises a periodic commutator or alternatingly connecting the measuring instrument to a tuning signal source which is adjustable by means of a main tuning device and a tuning signal source determined by the presetting device.

With such a receiver a transmitter which has been detected by means of the main tuning device can be taken over in the presetting device by so adjusting the latter device that the two scale displays which occur alternatingly owing to the periodic switch-over, coincide.

The invention will now be further explained with reference to the drawing which contains only one FIGURE with a simplified diagram of a receiver according to the invention.

In the FIGURE a tuning signal is supplied to a tuning signal input 1 of a tuning section 3 which is tunable by means of this tuning signal, which tuning signal is obtained from a master contact 4 of a commutator 5. This commutator 5 is shown in the drawing as a five-position switch but may, if so desired, have more or less positions and be constructed as an electronic commutator.

In the position shown in the drawing of the commutator 5 a tuning signal is obtained from a manually presettable tuning potentiometer 7 which forms part of a main tuning device 8. This presetting may be done directly or, if so desired, for example by means of motor control.

In the position shown in the drawing the master contact 4 of the commutator 5 is connected via a commutator 9 to a measuring instrument 11 which is used as a tuning scale. This measuring instrument may be provided with a visual display which, for example, contains light emitting diodes or liquid crystals but, if so desired may also be designed as, for example, a moving coil meter.

In the position shown in the drawing of the contacts of the switches 5 and 9 the measuring instrument indicates to which frequency or to which channel number the receiver has been tuned by means of the main tuning device 8.

In addition, the receiver has a presetting device 13 having a plurality of presetting potentiometers 15, 17, 19 and 21 whose adjustable contacts are connected to further inputs of the commutator 5. The potentiometers 15, 17, 19, 21 and 7 are connected to a stabilized voltage $V_1$.

If a person who operates the receiver wants to adjust a presetting potentiometer, for example potentiometer 21 to a transmitter found by means of a main tuning device then he connects, by means of a switch 23, a supply voltage $V_2$ to an astable multivibrator 25 which starts operating and supplies to a switch-over signal input 27 of the commutator 9 a periodically changing voltage so that the switch 9 assumes for a given period of time another position and alternatingly connects the tuning meter to the master contact of the switch 5 and the adjustable contact of the potentiometer 7. Then the tuning meter 11 will alternatingly indicate the value of the tuning signal derived from the presetting potentiometer 21 which is now fed to the tuning device 3 and the value of the tuning signal derived from the potentiometer 7. If now the presetting potentiometer 21 is so adjusted that only one indication takes place on the tuning meter or in the case that a moving coil meter is used the pointer of this meter is stationary, the presetting potentiometer is tuned to the transmitter to which also the manual tuning potentiometer 7 has been tuned.

It will be clear that the frequency at which the astable multivibrator 25 oscillates can be matched to the type of tuning meter 11.

The switch 23 with which the multivibrator 25 can be made operable is preferably coupled to a covering element, for example a lid, which makes the adjustable elements of the presetting potentiometers 15, 17, 19, 21 in the normal operating conditions inaccessable. When all presetting potentiometers have been adjusted to a desired transmitter, this lid is closed again, consequently the switch 23 is switched off again and the commutator 9 again assumes the position shown in the drawing so that the tuning meter indicates the value of the tuning signal supplied to the tuning section, which tuning signal may derive from the main tuning device 7, 8 or from the presetting device 13.

If so desired the switch 23 may also be separately controllable or, for example, be coupled to the commutator 5 or to the presetting elements of the presetting potentiometers 15, 17, 19, 21.

What is claimed is:

1. A receiver comprising a tuning section, an adjustable tuning signal source means for supplying to said section an electrical quantity corresponding to a frequency, a presettable tuning signal source means for supplying to said section an electrical quantity corresponding to a frequency, said electrical quantities causing said tuning section to be tuned to said corresponding frequencies respectively, a measuring instrument means for indicating the frequency to which an electrical quantity supplied by one of said sources corresponds, and means for providing presetting of said presettable source to an electrical quantity equal to an electrical quantity of said adjustable source including periodic commutator means coupled to said measuring instrument and source and means for alternately coupling each of said source means to said measuring instrument means.

2. A receiver as claimed in claim 1, further comprising a switch means disposed in said presettable source means for activating said commutator means.

3. A receiver as claimed in claim 1, further comprising an astable multivibrator means coupled to said commutator means for causing said commutator means to alternately couple each of said source means to said instrument means in accordance with a signal from said astable multivibrator means.

4. A receiver as claimed in claim 1, wherein said presettable source means comprises a plurality of presettable potentiometers, and further comprising a switch having a plurality of contacts coupled to said potentiometers respectively and a master contact coupled to said commutator.

* * * * *